(12) United States Patent
Pilling et al.

(10) Patent No.: US 7,518,842 B2
(45) Date of Patent: Apr. 14, 2009

(54) CIRCUITS AND METHODS THAT ATTENUATE COUPLED NOISE

(75) Inventors: David J Pilling, Los Altos Hills, CA (US); James Fox, San Jose, CA (US); Ken Chan, Saratoga, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 299 days.

(21) Appl. No.: 10/982,128

(22) Filed: Nov. 5, 2004

(65) Prior Publication Data

US 2005/0128664 A1    Jun. 16, 2005

Related U.S. Application Data

(60) Provisional application No. 60/517,975, filed on Nov. 5, 2003.

(51) Int. Cl.
*H02H 3/22* (2006.01)

(52) U.S. Cl. .......................................... 361/56; 361/111

(58) Field of Classification Search ............ 361/56–58, 361/91.1, 111; 257/355–360
See application file for complete search history.

(56) References Cited

U.S. PATENT DOCUMENTS 5,991,135 A * 11/1999 Saleh ........................... 361/56
5,999,386 A * 12/1999 Anderson et al. .............. 361/56
6,011,419 A *  1/2000 Nowak et al. ................ 327/310
6,262,873 B1 *  7/2001 Pequignot et al. ........... 361/111
6,271,999 B1 *  8/2001 Lee et al. ....................... 361/56

OTHER PUBLICATIONS

NurLogic 0.18 vm Custom 750MHz PLL for TSMC, NurLogic Design, Inc., San Diego, California, 10 pages, Dec. 20, 2001.
TSMC Macrocells Data Sheet PG13E3G3: 400MHz PLL-Based Clock Generator, Taiwan Semiconductor Manufacturing Company, Limited, pp. 1-12, Dec. 6, 2001.

* cited by examiner

*Primary Examiner*—Danny Nguyen
(74) *Attorney, Agent, or Firm*—Finnegan, Henderson, et al

(57) ABSTRACT

Systems and methods of chip design and package implementation for attenuating noise in timing circuits, including phase-locked-loops (PLL) and delay-locked-loops (DLL), are disclosed. Embodiments of the present invention attenuate coupled noise, such as the effects of ground current surges, or power supply noise coupling through electro-static discharge (ESD) structures. In known systems, the ground supplies for the timing circuits are designed with power and ground supplies, separate from the core power and ground; although the ground supplies are connected via common $V_{SS}$-substrate, they are separated from pad ring output driver power and ground supplies. In embodiments of the present invention, the PLL or DLL and core supplies are kept separate from the output driver power and ground supplies, providing for improved systems and methods that attenuate the effects of ground current surges from chip output drivers as they switch from logic highs to logic lows.

24 Claims, 11 Drawing Sheets

CIRCUITS AND METHODS THAT ATTENUATE COUPLED NOISE

CROSS-REFERENCE TO RELATED APPLICATIONS

This application claims the benefit of U.S. provisional application No. 60/517,975, filed Nov. 5, 2003, which is incorporated herein by reference.

BACKGROUND OF THE INVENTION

1. Field of the Invention

The present invention relates generally to integrated circuits and methods of integrated circuit construction that provide attenuation of current surges, and more specifically to improved systems and method of chip design and package implementation for attenuating the effects of ground current surges in timing circuits.

2. Description of Related Art

In general, timing circuits are susceptible to surrounding circuit noise, which oftentimes increase the "jitter" of the oscillation frequency and phase of the desired timing signal. With the placement of increasing quantities of timing circuits and/or system clocks, for example phase-locked loops (PLLs) and delay-locked loops (DLLs), within the confines of each chip, the necessity of considering noise reduction for each timing circuit becomes increasingly important.

Specifically, capacitive filters alone between supply and ground have been shown not to relieve the root causes of power supply and ground noise. Further, capacitive coupling by way of Electro-Static Discharge (ESD) structures to sensitive timing circuits is a liability.

Additionally, system clocks are sensitive to all power supply and ground noise as well as noise from certain types of drivers, whether that noise is generated externally or internally to the integrated circuit chip. Thus, the supply and grounding methods for system clocks on an integrated circuit ("IC") chip, such as the PLLs and DLLs, are frequently isolated from the board supply and ground with inductive filters. Individual circuits of the PLL and DLL, such as voltage-controlled oscillators (VCOs), phase detectors, dividers, and charge pumps, then, are isolated from each other when integrating these circuits onto a single silicon chip.

Building upon the short-sighted foundational precepts of the subject isolation and grounding technologies, the direction promulgated by suppliers understandably also fails to present credible solution to the current noise problems. Specific instructions from vendors offering timing circuits, such as PLL (phase-lock loops) and DLL (delay-lock-loops) separate power supply nodes, ground nodes for the componenets of these circuits, i.e., the phase detector, voltage controlled oscillator, divider, and driver circuits. These circuits in turn isolate the supply and ground nodes of the chip core circuits from the timing circuits.

The teaching of this invention is consistent with vendor instructions only in so far as requiring separate power supplies but differ in that individual ground nodes are electrically tied to a common node.

In recent years, the combination of factors such as substrate noise induced by high current output drivers on the chip and power supplies with low voltage supply potentials has been shown to cause timing circuits to malfunction.

The magnitude of a timing circuit malfunction can be measured by the distortion of the circuit's clock periods and is often expressed in terms of "jitter". "Jitter" is the difference in phase between adjacent clock cycles in a cycle-to-cycle measurement, or between clock cycles separated by a specific number of intervening cycles. The latter measurement is termed "long-term cycle drift". In essence, then, a timing circuit's sensitivity to noise can be expressed in terms of clock jitter.

Clock jitter, given by the compression and expansion in a series of adjacent clock periods, can limit the time allotted for logic delays bounded between rising and falling clock edges. Jitter affects the overall operation of any given clock circuit, inter alia, by limiting the maximum operating frequency of the chip.

With respect to the isolation of clock jitter, power supplies in the range of 1.0 to 1.2 volts limit the headroom, and do not allow the use of current source isolation. In higher voltage supplies, e.g., those operating at 1.8 volts or greater, current source isolation circuits are traditionally inserted between the internal circuits and a noisy supply and ground to minimize the effects of clock jitter in sensitive circuits such as VCOs.

Conventionally, it has been assumed that isolating the power and ground circuits for each timing circuit on an IC was the way to reduce the jitter in the timing circuit. FIG. 1 illustrates an embodiment of such presently recommended practice for a conventional embedded PLL timing circuit, one with separate power and ground supplies. The circuit diagram 100 of FIG. 1 includes three representative sections of the chip 101, an Input/Output ("I/O") circuit 102, a core circuit 104, and a timing circuit 106 such as a Phase Lock Loop (PLL) or a Delay Lock Loop (DLL) circuit. As shown in FIG. 1, each of the three representative circuits is provided with its own supply voltage as well as its own ground supply. Specifically, I/O circuit 102 is provided with a first +3.3 volt power supply 110, and a 3.3 volt ground connection 112, while core circuit 104 is provided with a +1.0 volt power supply 116, and a 1.0 volt ground connection 118. Similarly, the timing circuit 106 in such conventional arrangements is connected to both a +3.3 volt power supply 122 and a +1.0 volt power supply 124, as well as complementary ground supplies of 3.3 volts 126 and 1.0 volts 128; these supply potentials being separate/distinct to provide the isolation between the timing circuits previously sought.

A chip 101, as described in connection with FIG. 1, is typically fabricated on a grounded, P-doped substrate. The ground pins are generally connected to the P-doped substrate with transistor ground taps to prevent circuit problems such as latch up. With respect to such substrate and grounding issues, illustrations of ground nodes and associated resistive connections to such ground nodes of exemplary chip 101 are set forth next in connection with FIG. 2. Common recommended usage excludes the use of metal to combine ground nodes for all on-chip circuits.

FIG. 2 is a representative cross-sectional view of chip 101, illustrating the resistive connectivity of ground nodes to a P-doped substrate 202. As shown in FIG. 2, a first ground node 206 is shown connected to the 1.0 volt ground supply 118 to the core circuit, a second ground node 208 is shown connected to the 1.0 volt ground supply 128 to the timing circuit, a third ground node 210 is shown connected to the 3.3 volt ground supply 126 to the timing circuit, and a fourth ground node 212 is shown connected to the 3.3 volt ground supply 112 to the I/O circuit. Each of the respective ground nodes, 206, 208, 210 and 212, in turn, is shown as being connected to the P-doped substrate 202 by means of a representative resistance, 226, 228, 230 and 232, respectively. The model representative resistances, 226, 228, 230 and 232, are indicative of the differing phase delays of the discharge pathways, especially with respect to the sensitivity many current low voltage technologies have concerning such impedance.

Accordingly, there is a need for timing circuits that attenuate the effects of ground current surges from chip output drivers in order to obtain low-noise timing circuits.

BRIEF SUMMARY

In accordance with embodiments of the invention, integrated circuits and methods of integrated circuit construction that provide attenuation of current surges for timing circuits, including phase-locked-loops (PLL) and delay-locked-loops (DLL), are disclosed. In known systems, the ground supplies for the timing circuits are designed with separate external power and ground supplies, separate from the core power and ground; although the ground supplies are connected via common $V_{SS}$ substrate, they are separated from the metalized pad ring output driver power and ground supplies. In embodiments of the present invention, the PLL or DLL and core power supplies are kept separate from the output driver power and ground supplies, providing for improved systems and methods that attenuate the effects of ground current surges from chip output drivers as they switch from logic highs to logic lows. According to one or more embodiments, the timing circuit ground supplies are combined with the substrate ground, with the joining of selected ground systems being achieved at the chip (metalized) level or at the package (substrate) level.

Further advantage can be achieved by embodiments of the present invention in which the PLL or DLL and core supplies are kept separate from high current output driver power and ground supplies. In such embodiments, it is necessary that each independent/separate power supply has a separate coupling capacitor. According to these embodiments, the PLL or the DLL ground supplies are combined with the core ground at either the chip or package level.

One or more embodiments further provide a semiconductor integrated circuit comprising one or more circuit elements, at least one timing circuit, a conductive ground line, and a conductive power supply line, wherein core and ground supplies of the at least one timing circuit are connected to or kept separate with the output driver power and ground supplies to attenuate the effects of ground current surges.

In one embodiment, a semiconductor integrated circuit according to the present invention comprises a first circuit having a first power supply and a first ground supply, and a second circuit having a second power supply and a second ground supply, wherein the first ground supply is coupled with the second ground supply to form a common ground, and wherein the first power supply and the second power supply are kept separate, with each power supply being capacitively coupled to the common ground with a filter unique to each power supply, whereby undesirable/unwanted circuit noise is attenutated. Further embodiments contemplate various adaptations of timing circuits taking advantage of this attenuation including specifics of the surrounding circuits, electro-static discharge structures, filters and other related circuit elements, as set forth in the written description, drawings and claims, below. Embodiments covering permutations based upon those expressly set forth herein are also contemplated.

These and other embodiments of the invention are further described herein with respect to the following figures. It is to be understood that both the general description of embodiments of the invention and the following detailed description are exemplary and explanatory only and are not restrictive of the invention.

In the figures, elements having the same identification have the same or similar function.

DETAILED DESCRIPTION

Figure 3:
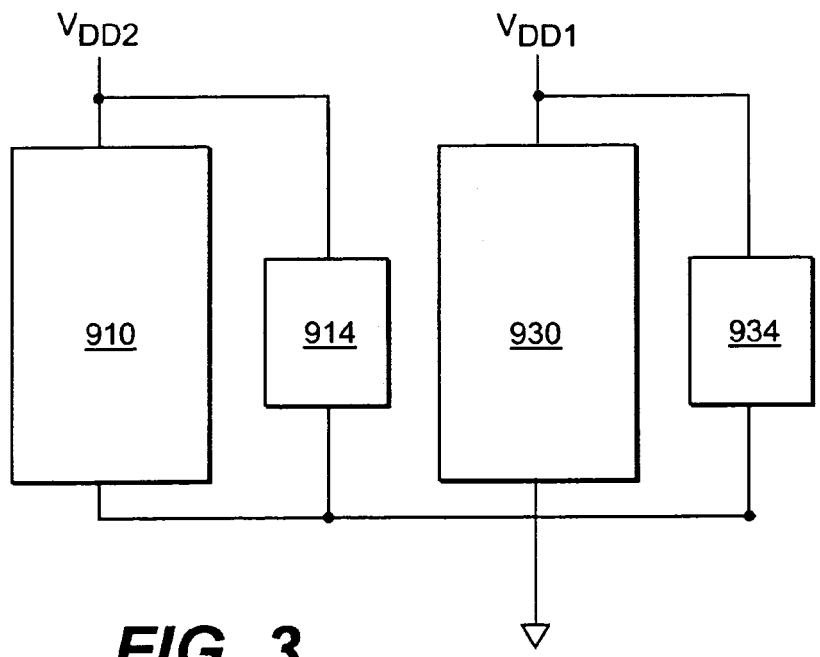
FIG. 3 is a diagram of two circuit blocks showing a common ground with separate power supplies and filters, according to one or more embodiments of the present invention.

Diagrams of two circuit blocks (first circuit 910 and second circuit 930) are shown in FIG. 3, according to one or more embodiments of the present invention, having a common ground and separate power supplies, each with their own respective filters unique to each power supply (first filter 914 and second filter 934).

Figure 1:
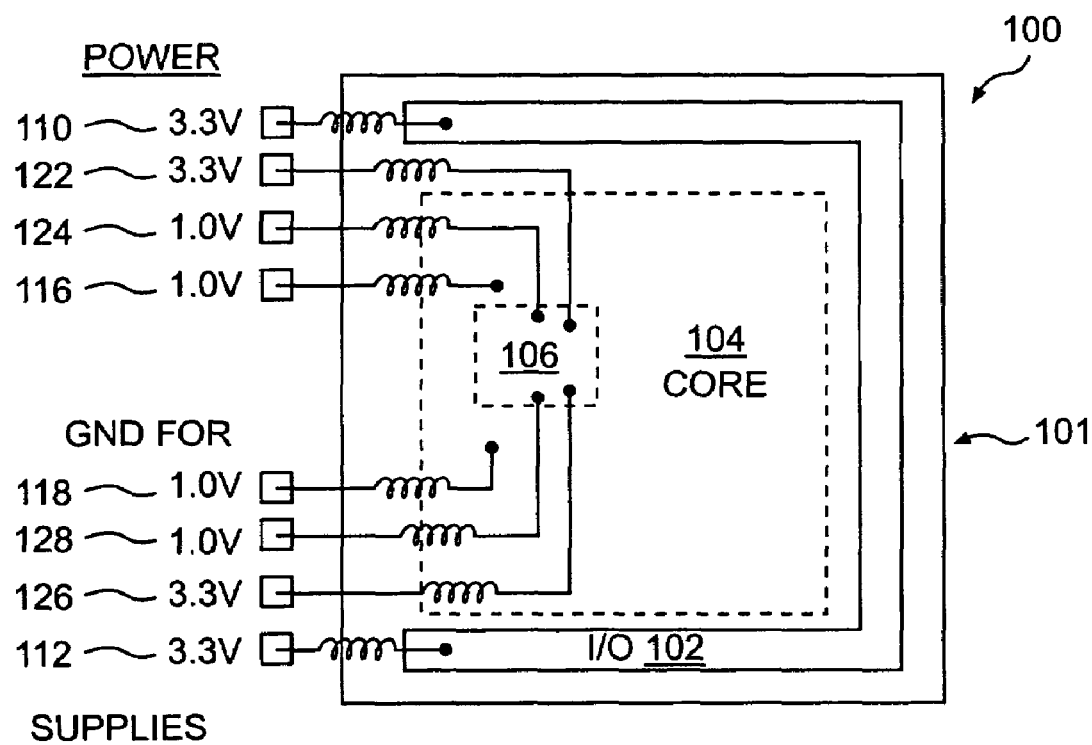
FIG. 1 is an illustration of a representative circuit diagram showing isolated power and ground supplies for an exemplary embedded timing circuit.
Figure 2:
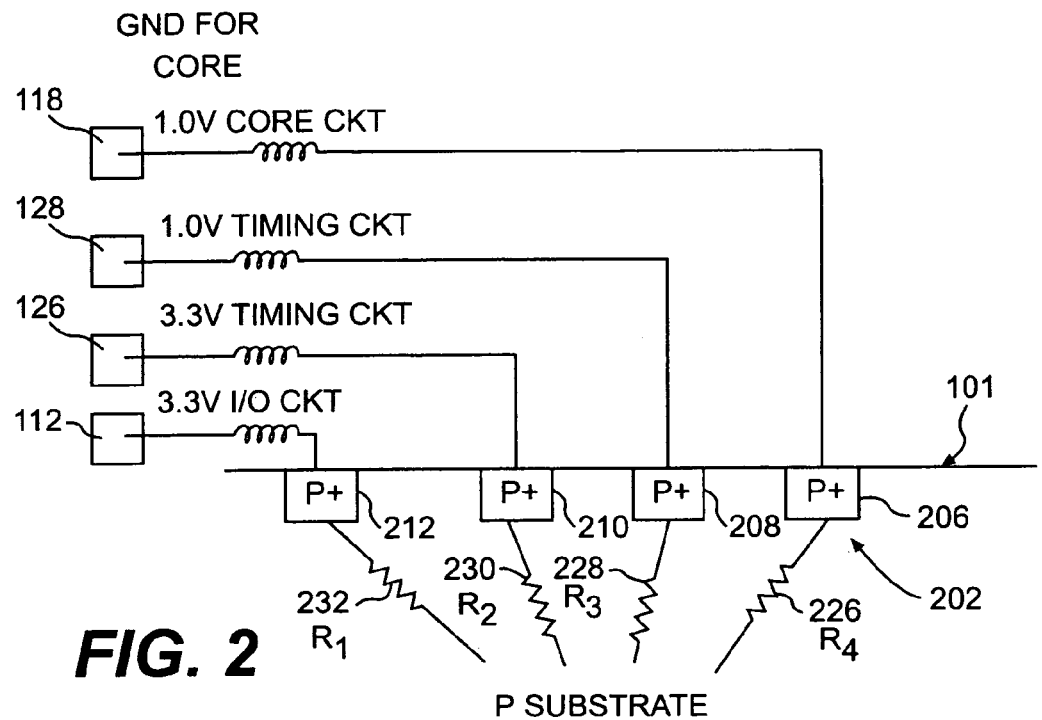
FIG. 2 is an illustration of a cross-sectional view of substrate, showing representative connections of ground nodes.
Figure 4A:
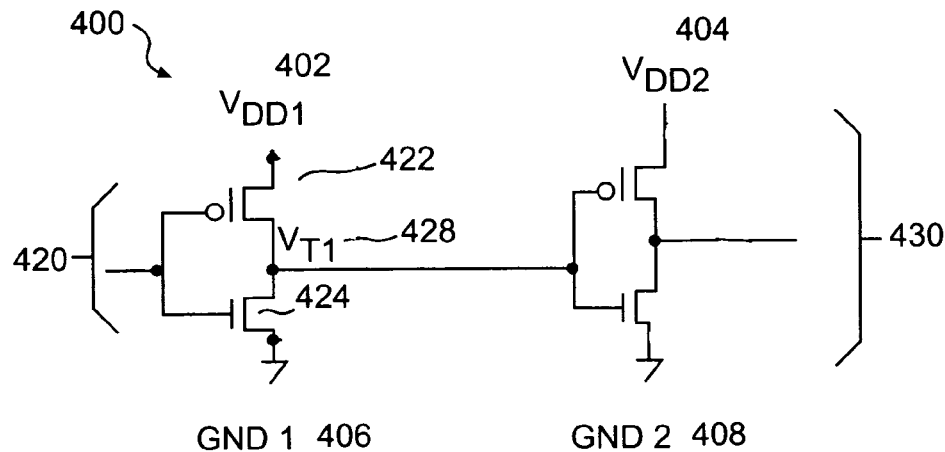
FIG. 4A is a circuit diagram illustrating a transistor-level circuit model.

FIG. 4A is a circuit diagram illustrating a transistor-level circuit model 400 that is representative of two of the circuits associated with chip 101, as may be set forth in FIGS. 1-3. FIG. 4A is illustrative of the interface between two circuits, such as the I/O circuit or the core circuit with the timing circuit, as set forth in the discussions above. A first representative circuit 420 is also set forth in FIG. 4A. First representative circuit is comprised of first and second transistors 422 and 424 representative of overall circuitry that acts to provide the relevant output threshold voltage, $V_{T1}$ 428, of interest here. It is the interplay, then, of this first threshold voltage, $V_{T1}$ 428, with the operating threshold of second representative circuit 430, as set forth below. Again, however, these circuits are merely exemplary, as the present teachings apply to the combination of any salient circuit (i.e., in addition to the I/O and core circuits) used in association with such timing circuits.

Turning back to FIG. 4A, it is instructive to examine the interplay between representative supply voltage $V_{DD1}$ 402 as it increases and representative supply voltage $V_{DD2}$ 404 as it decreases. In this regard, the output voltages $V_{DD1}$ and $V_{DD2}$, in association with their ground potentials, GND1 406 and GND2 408, respectively, are set forth in graph 440 of FIG. 4B.

Figure 4B:
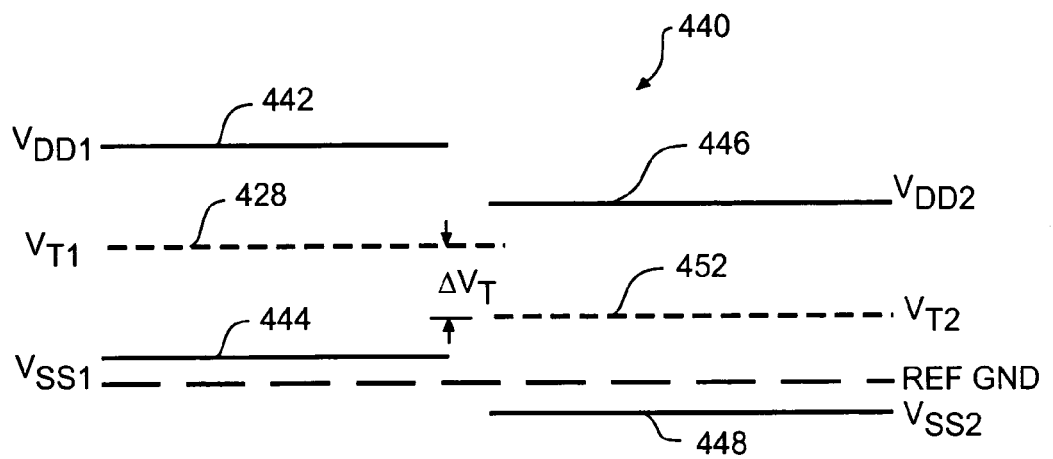
FIG. 4B is an illustration comparing output waveforms of the circuit of FIG. 4A.

FIG. 4B compares output waveforms of the circuit of FIG. 4A, illustrating mismatched thresholds $V_{T1}$ and $V_{T2}$ resulting from mismatched ground ($V_{SS}$) and supplies ($V_{DD}$). In FIG. 4B, graph 440 illustrates a comparison of $V_{DD1}$ potential 442, GND1 potential 444, $V_{DD2}$ potential 446, and GND2 potential 448, all arranged on the vertical axis of graph 440 during the signal transmission time for a difference in respective ground and supply potentials. As seen in the upper portion of graph 440, a left half threshold voltage $V_{T1}$ 428 is set as the potentials of $V_{DD1}$ 442 and GND1 444 transition from logic low to logic high. Similarly, in the right half portion of graph 440, a second threshold voltage $V_{T2}$ 452 is set as the potentials of $V_{DD2}$ 446 and GND2 448 transition from logic high to logic low.

As seen by the comparison of the deviation in the first threshold voltage 428 from the base voltage, with the corresponding deviation of the second threshold voltage 452, such mismatched thresholds can inherently result from separate supply and ground potentials. Thus, this mismatch produces an inconsistency or delay in the signal transmission, and the interface voltage levels $V_{T1}$ 428 and $V_{T2}$ are subject to the noise associated with this delay. Further, such threshold and noise conditions yield stretched or truncated waveforms for pulse applied to the circuit. The inconsistency can be coalesced to the basic circuit diagram set forth in FIG. 4C.

Figure 4C:
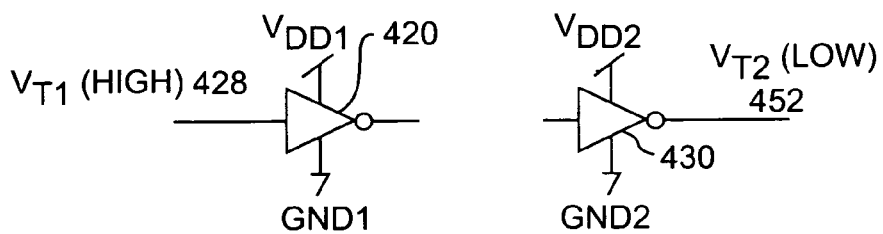
FIG. 4C is a circuit diagram illustrating a simplified circuit representative of the circuit of FIG. 4A.

FIG. 4C is a circuit diagram illustrating a simplified circuit corresponding to the circuit of FIG. 4A. In essence, application of a logic high at the first interface voltage $V_{T1}$ 428 to a second representative circuit 430 operating a $V_{T2}$ 452 logic low causes an imbalance of rise stalltime delays, when the ground supplies are separate, resetting from the mismatched threshold voltages between the two circuits. Chip or package level interconnection of common ground and/or power connection, as set forth below, serves to reduce this effect.

Figure 5:
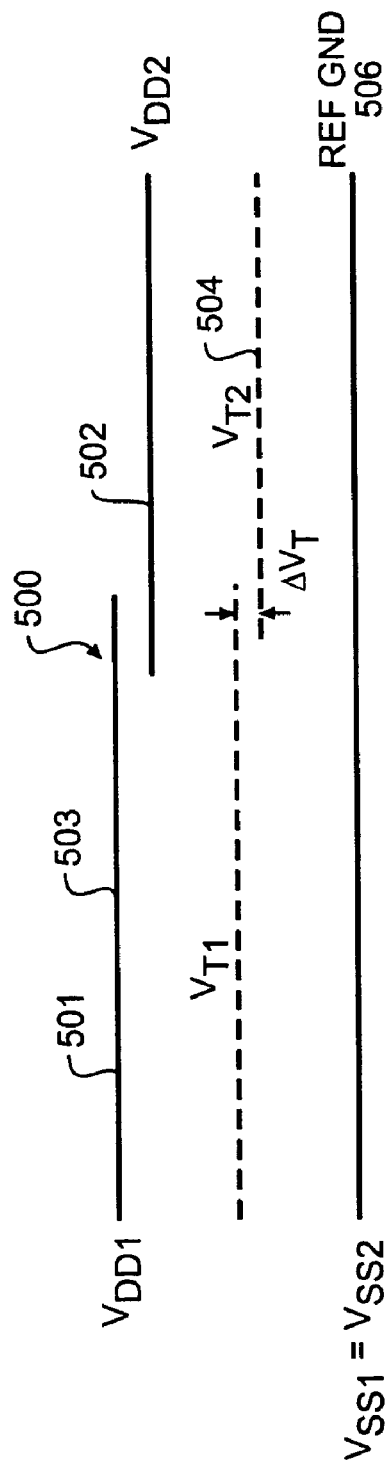
FIG. 5 is an illustration comparing output waveforms of embedded circuits, according to one or more embodiments of the present invention.

FIG. 5 is an illustration comparing output waveforms of embedded circuits sharing common ground connections, according to one or more embodiments of the present invention. Graph 500 of FIG. 5 illustrates a comparison of interface voltage levels. Graph 500 shows $V_{DD1}$ 501, $V_{DD2}$ 502, reference ground 506, the threshold/interface voltage level for $V_{DD1}$ 503, and the threshold/interface voltage level for $V_{DD2}$ 504. Here, note that the first and second ground supplies, GND1 and GND2, are tied together. However, timing signal distortion, leading to failures, occurred when both the power supplies and the ground connections were in common for large circuit blocks.

FIG. 5 illustrates the reduction in the change of threshold voltage, $V_T(\Delta V_T)$, resulting in a mismatch of $V_{DD1}$ and $V_{DD2}$. As shown in the graph 500, active circuit behavior can typically produce the $V_{DD}$ and threshold voltage outputs set forth herein. Note that these output waveforms, representative of circuits possessing the inventive power and ground supply connections set forth herein, have minimum offset and the corresponding circuits have negligible distortion related thereto. Thus, FIG. 5 reflects an implementation, according to one or more embodiments, that avoids the offset and distorted waveforms discussed above. Unlike prior systems, then, the waveform here is not stretched or truncated such that the trigger point is either missed or otherwise compromised.

Figure 6:
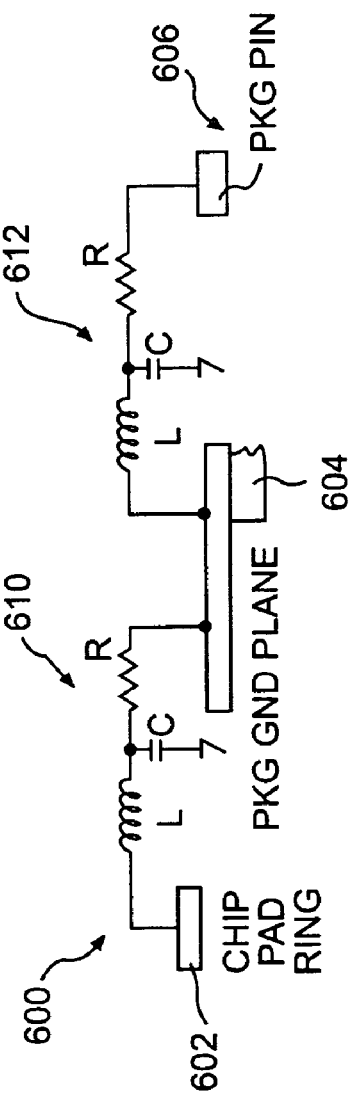
FIG. 6 is an illustration showing exemplary chip level and package level ground connections, according to one or more embodiments of the present invention.

FIG. 6 depicts a circuit model 600 showing exemplary chip level and package level ground connections, according to one or more embodiments of the present invention. Circuit model 600 is a simplified diagram illustrating a representative chip portion 602, a representative pad ring (e.g., ground plane) contact 604, and a representative package lead interconnect 606. Also illustrated in circuit model 600 are a first electrical connection 610 between the chip portion 602 and the pad ring contact 604, as well as a second electrical connection 612 between the pad ring contact 604 and the package lead interconnect 606. The first electrical connection 610 is representative of chip level connection, a first type of common connection (i.e., to ground or to supply). These chip level connections can be made at any point along the electrical pathway, from the earliest point of electrical differentiation at the chip or chip lead (including within the chip itself), through the intermediary electrical path, to any salient portion of the pad ring. The second electrical connection 612 is representative of a second type of common connection that can be made, namely package level connections. As with the chip level connectons, these package level connections can be made at any available point along the electrical pathway.

The detailed circuit analysis below provides particularized support for the various power and ground supply attenuation techniques disclosed throughout. The following analysis addresses, specifically, the minimization of power supply and ground supply distortion that is addressed by the various coupling circuits and methods set forth herein. Additionally, the common coupling disclosure provided throughout are generally applicable to various circuit pairings selected from the group consisting of input drivers, output drivers, timing circuits, and core circuits. However, it should also be noted that output high current drivers would have independent power and ground (as opposed to the common ground arrangement discussed, e.g., in connection with FIG. 5). This is permissible because the delays of the timing of the output circuits contribute to significant noise and their delays are not critical. It is noted that low current output drivers can be coupled on the common ground without deleterious effects.

Figure 7:
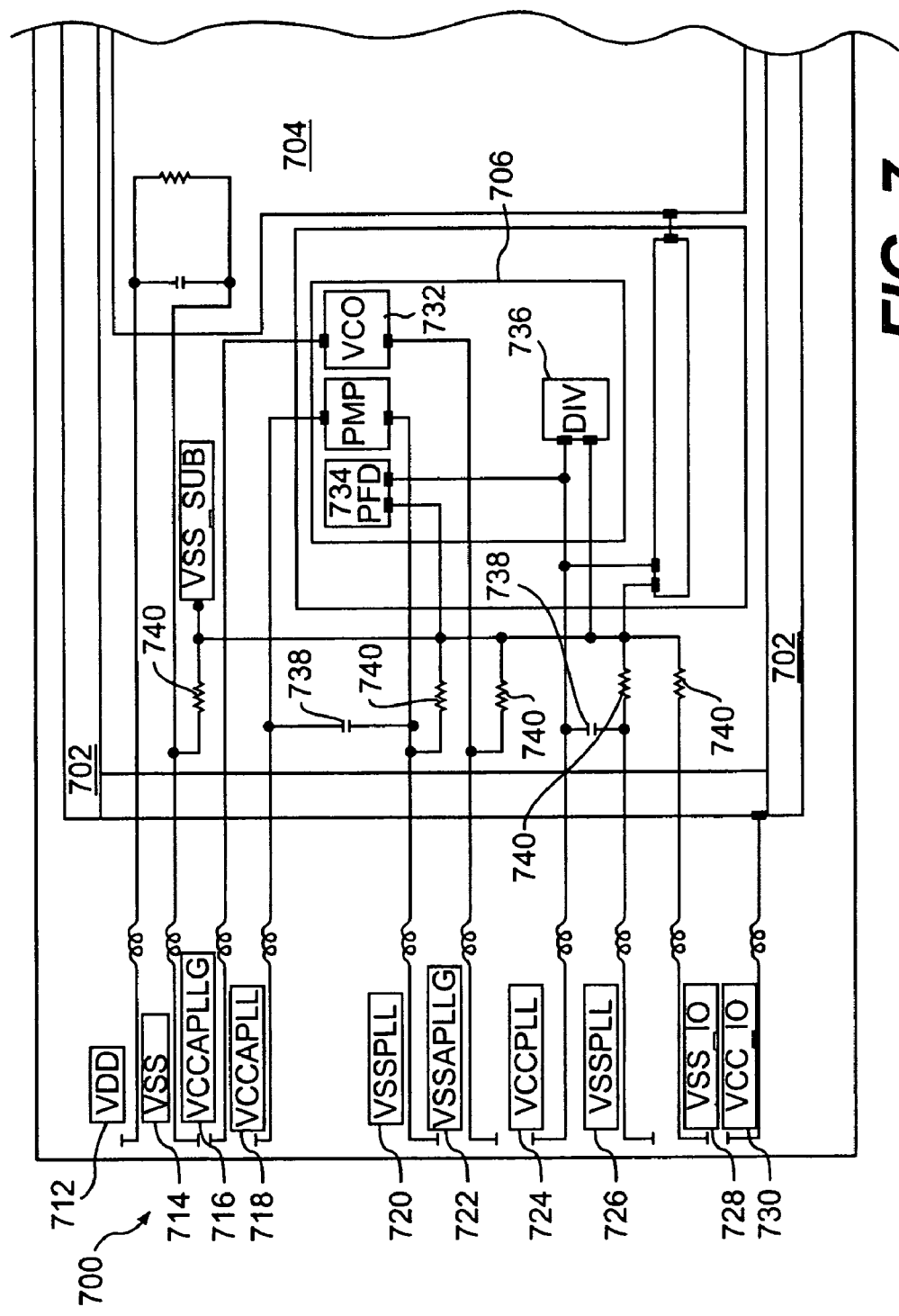
FIG. 7 is a block diagram illustrating regions of interest on an embedded controller chip.
Figure 8:
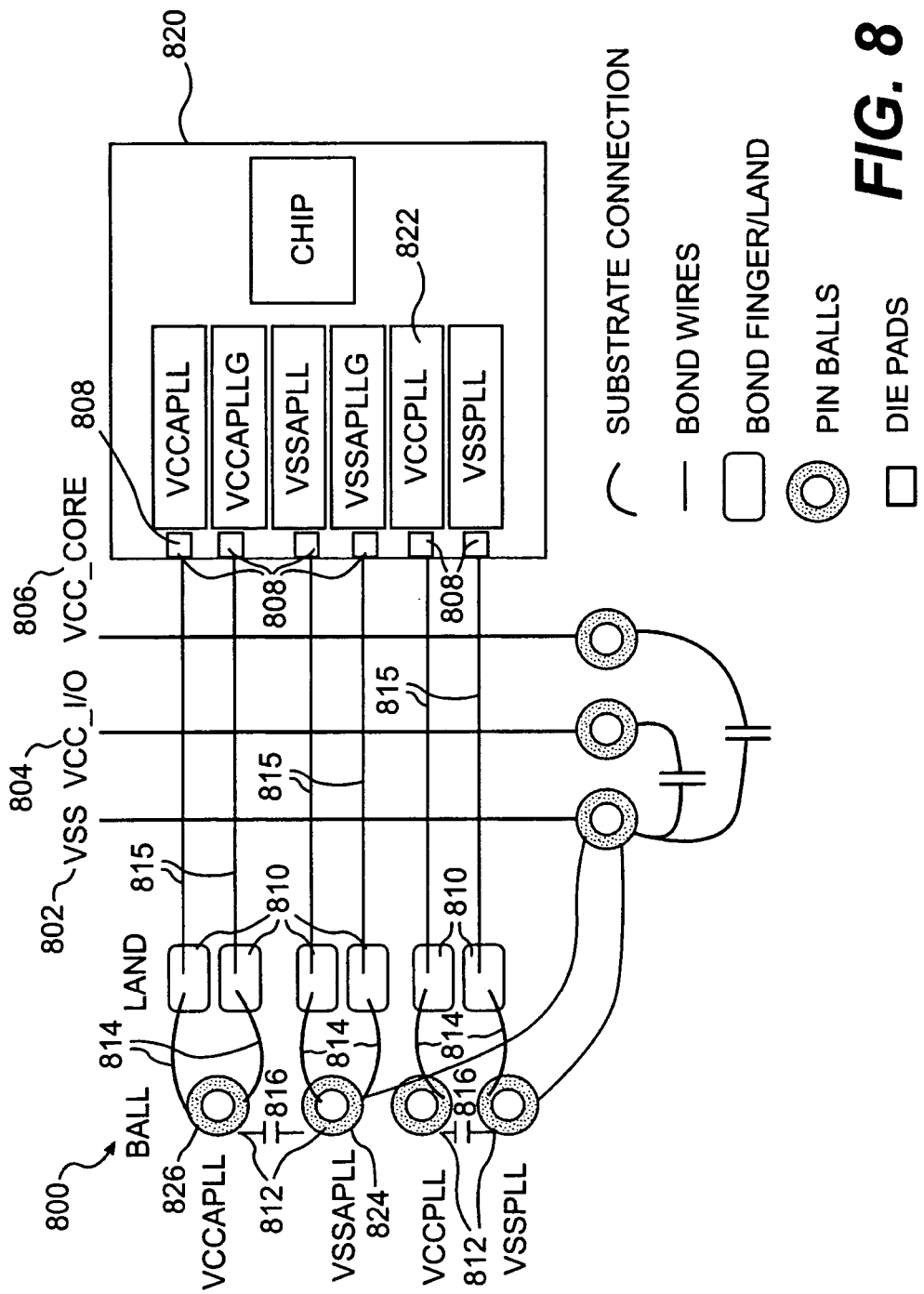
FIG. 8 is a package-level circuit diagram illustrating a bonding arrangement, according to one or more embodiments of the present invention.

Discussion of one or more implementations of the present invention begins with a brief background review relating to the supply and ground connectivity technology. FIGS. 7 and 8 provide some existing circuit arrangements relating to such technology. FIG. 7 illustrates a circuit diagram of an embedded controller chip 700 that can contain more than one million transistors and can be packaged with over four hundred pins. As seen in FIG. 7, a representative IC chip 700 includes three main sections, the external driver section 702, the core section 704, and the timing circuit section 706. In addition to chips of this level of integration, chips with fewer transistors, fewer power leads, and/or fewer ground leads could also constitute further example of isolated or separated power supplies and ground connections.

As is shown in FIG. 7, each timing circuit is supplied with its own supply voltage and ground to provide isolation between timing circuits. Also present in chip 700, and having association with such supply voltage(s), are capacitive filter components 738 (shown in the figure as capacitors, though not limited strictly thereto) as well as resistive elements 740.

Turning to the regions of chip 700, the core section 704 is electrically connected with core supply ($V_{CC}$) and ground ($V_{SS}$), with each of core supply and ground being respectively associated with 24 pins (not shown). With respect to impedance, the core capacitance of the chip shown in FIG. 7 is estimated to be 1,000 pF and draws a core operating current equivalent to a 0.65 ohm resistor for a 1.0 volt supply.

The timing circuit blocks are powered by two high-voltage supply and ground pin pairs—$V_{CCAPLLG}$ 716 and $V_{SSAPLLG}$ 722; and $V_{CCAPLL}$ 718 and $V_{SSAPLL}$ 720. $V_{CCAPLLG}$ 716 and $V_{SSAPLLG}$ 722 are connected to phase-locked loop VCO 732 (voltage controlled oscillator). VCO 732 is sensitive to noise, though it can also be a source of noise. $V_{CCAPLLG}$ 716 and $V_{SSAPLLG}$ 722 are isolated from the other high-voltage pair, $V_{CCAPLL}$ 718 and $V_{SSAPLL}$ 720, which is a relationship termed "quiet". A single pair of low-voltage terminals, labeled $V_{CCPLL}$ 724 and $V_{SSPLL}$ 726 supplies power to the phase detector circuit, PFD, 734 and the feedback divider circuit 736.

With respect to the final control circuitry illustrated in FIG. 7, the high-voltage external driver sections 702 are supplied by power and ground connections, $V_{CC\_IO}$ 730 and $V_{SS\_IO}$ 728, each having, e.g., twelve pairs of terminals. In packaging, these power and ground pins, as well as the core power and ground pins, are distributed uniformly around the circumference of the chip.

Typically, the chip illustrated in FIG. 7 is fabricated on a grounded, P-doped substrate. Each ground pin, $V_{SS}$ 714, $V_{SS\_IO}$ 728, $V_{SSAPLLG}$ 722, $V_{SSAPLL}$ 720, and $V_{SSPLL}$ 726; is connected to the P-doped substrate with transistor ground taps. The purpose of the transistor ground taps is to prevent latch-up. The output driver ground terminal, $V_{SS\_IO}$ 728, has a separate ground pad in addition to its connection to the P-doped substrate ground. Despite low-resistance metal leads to a bonding pad, significant inductance between each circuit and ground can be present. Further, individual ground systems can communicate with each other by their mutual connection to the P-doped substrate; most notably, $V_{SS\_IO}$ 728, the ground for the output drive, readily communicates with the other ground connections through the substrate.

FIG. 8 depicts the recommended state-of-the-art bonding of grounds associated with timing circuits. The ball grid array (BGA) package 800 shown in FIG. 8 includes the bonding for PLL power and ground with three heavy vertical lines representing $V_{SS}$ 802, $V_{CC\_IO}$ 804 and the $V_{CC\_CORE}$ 806 substrate connection planes. Chip die pads 808, bond fingers/lands 810, pin balls 812, and bond wires 814 are shown. The thin wires 815 represent external board connections. Board capacitors 816 are shown connected to the pin balls. The bond wire inductance varies typically from 3 nanoHenries to 7 nanohenries. The chip high voltage supplies, $V_{CCPLLG}$ 820 and $V_{CCPLL}$ 822 are joined at the ball designated $V_{CCAPLL}$ 826. Similarly, the high voltage ground supplies are joined at the ball designated $V_{SSAPLL}$ 824. Consequently, for such known systems, bond wire inductances produce isolation at the chip die pad, by the pad.

Figure 9:
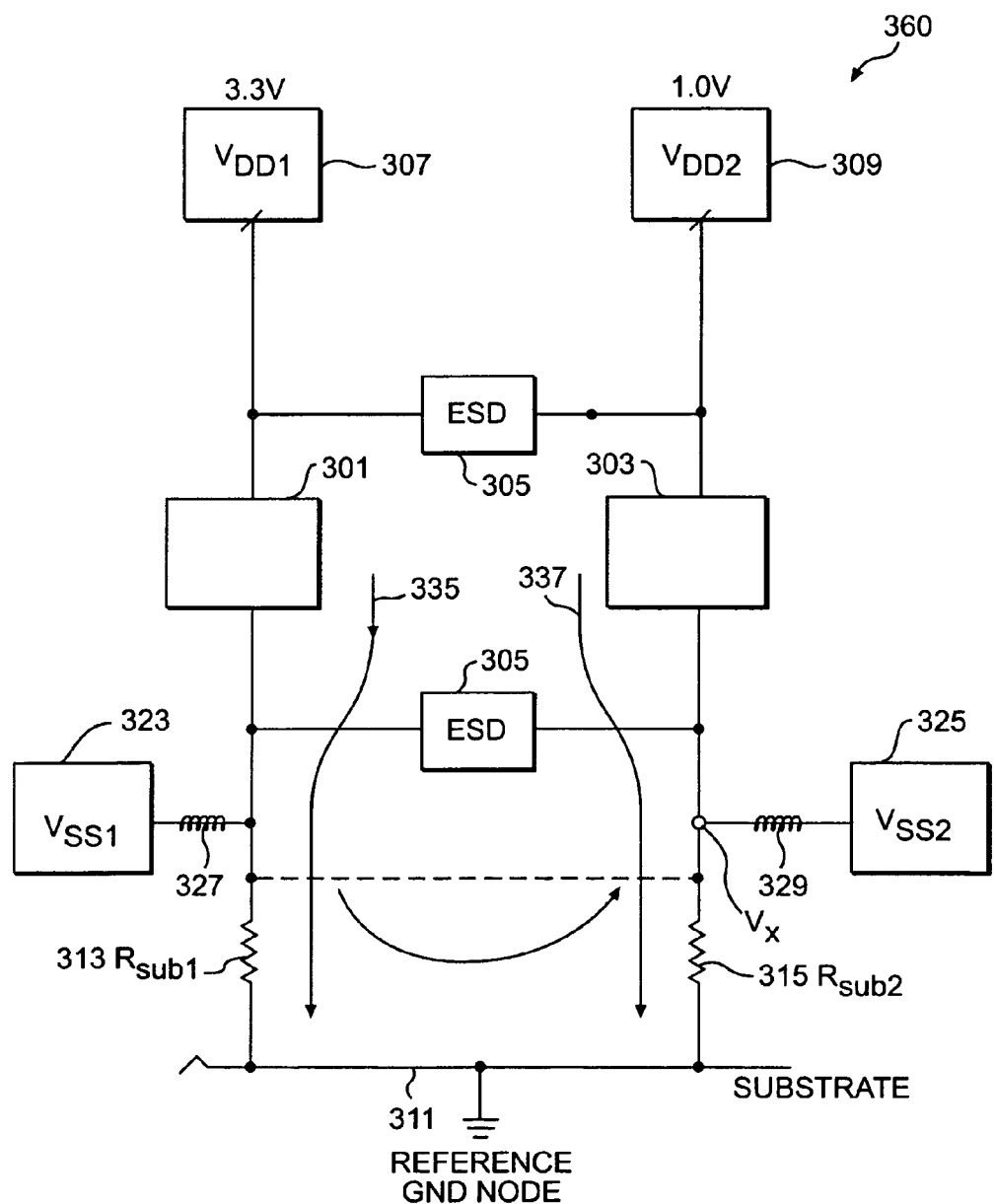
FIG. 9 is a circuit diagram illustrating a transistor-level circuit structure according to one or more embodiments of the present invention.

Shifting back to discussion of the present invention, FIG. 9 is a circuit diagram illustrating a transistor-level circuit structure, according to one or more embodiments of the present invention. As seen in FIG. 9, embodiments of the invention are shown modeled via circuit diagram 360, which is comprised of a base circuit 301, a timing circuit 303 (e.g., a PLL, etc.), electro static discharge devices 305, first and second source voltages, $V_{dd1}$ 307 and $V_{dd2}$ 309, a ground node 311 (e.g., twin-well substrate), as well as first and second impedances to the substrate $R_{sub1}$ 313 and $R_{sub2}$ 315. Despite the loads 323 and 325 representative of the low LC components 327 and 329 of these first and second impedances, $R_{sub1}$ 313 and $R_{sub2}$ 315 are still most properly modeled as substantially resistive connections to substrate. Although not shown, coupling capacitors could be used to help attenuate current surges in circuits that do not otherwise take advantage of at least one embodiment of the present invention. However, use of decoupling capacitors include small series resistors to lower the resonant "Q" factor of the LRC network.

The sensitivity of such circuits is also illustrated in the model circuit of FIG. 9. First current flow path 335 and second current flow path 337 are shown traveling through the base circuit 301 and the timing circuit 303, respectively. When circuits modeled as shown in circuit diagram 360 are powered by discrete voltage and ground connections, a phase delay or ground bounce begins to contribute noticeably to the noise (e.g., ground current surges, etc.) in the latest low voltage regimes. Lastly, it is noted that ESD structures 305 are shown in block diagram form, as industry has a number of known ways of implementing the various specific ESD structures suitable for such application. One cause of the above-discussed noise might also be readily seen via ESD discharge pathway models associated with timing (PLL) circuit 303. ESD discharge pathway models would reflect how ESD-induced failures and PLL noise perturbations can be avoided by using stand-alone ESD structures for supply sensitive timing circuits.

In embodiments of the present invention, the PLL or DLL and core supplies are kept separate from the output driver power and ground supplies, providing for improved systems and methods that attenuate the effects of ground current surges from chip output drivers as they switch from logic highs to logic lows. According to some embodiments, the PLL or the DLL ground supplies are combined with the core ground, with the joining of ground systems being achieved at the chip level or at the package level, providing for improved systems and methods that attenuate the effects of ground current surges from chip output drivers as they switch from logic highs to logic lows.

Figure 10:
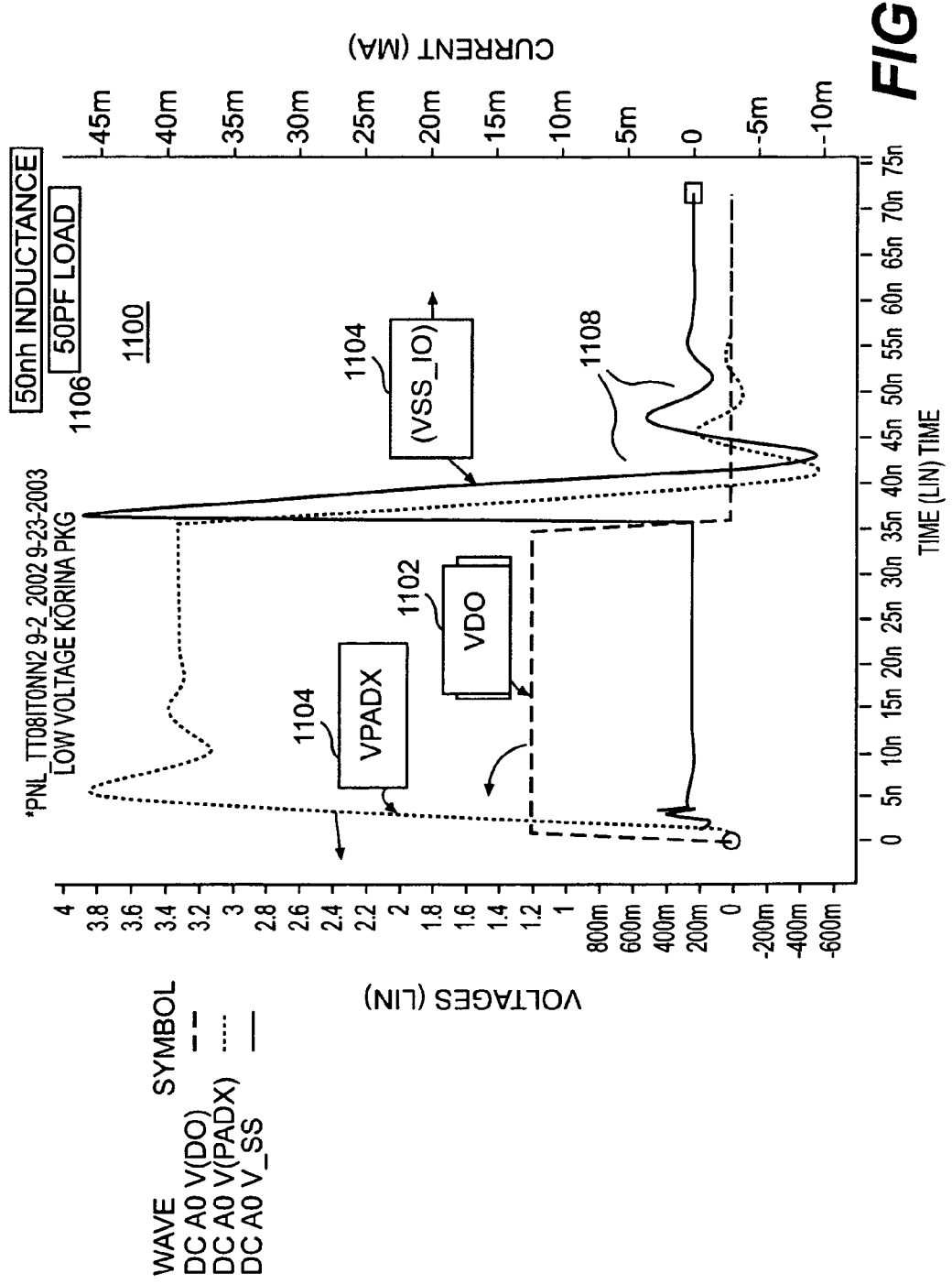
FIG. 10 is a graph illustrating voltage and current waveforms according to one or more embodiments of the present invention.

The effects of large surge currents in the system ground connectivity can also be seen in the operation of a representative output driver. A graph 1100 of the simulated voltage and current waveforms for a single output driver 1102 switching from a logic high to a logic low is shown in FIG. 10. The input waveform to the output driver is labeled Vdo 1102, and the output waveform of the output driver is labeled Vpadx 1104. The ringing, or inductive bounce 1108, of the output waveform is a result of the package inductive and capacitive load. The discharging current for a 50 picoFarad series 50 nanoHenry load is labelled I(Vss_io) 1104 and reaches a peak 1106 of 45 ma. Much of this current is discharged into the separate driver ground, Vss_IO. The inductive bounce 1108 shown in the output waveforms of FIG. 10 is reflected through the substrate and the capacitive coupling of the ESD transistors Q1 1026 and Q2 1028 and diode D1 1030 of FIG. 10. The simulated waveforms for power and ground reflect the surge of ground current, in part dissipated by the inductive output driver ground leads, and in part through the PLL and core ground systems connected to the P substrate. As seen here, these losses from a single pulse from the output clock, concerning the conditions representing the chip in its original bonding configuration of FIG. 8, can be significant.

Figure 11:
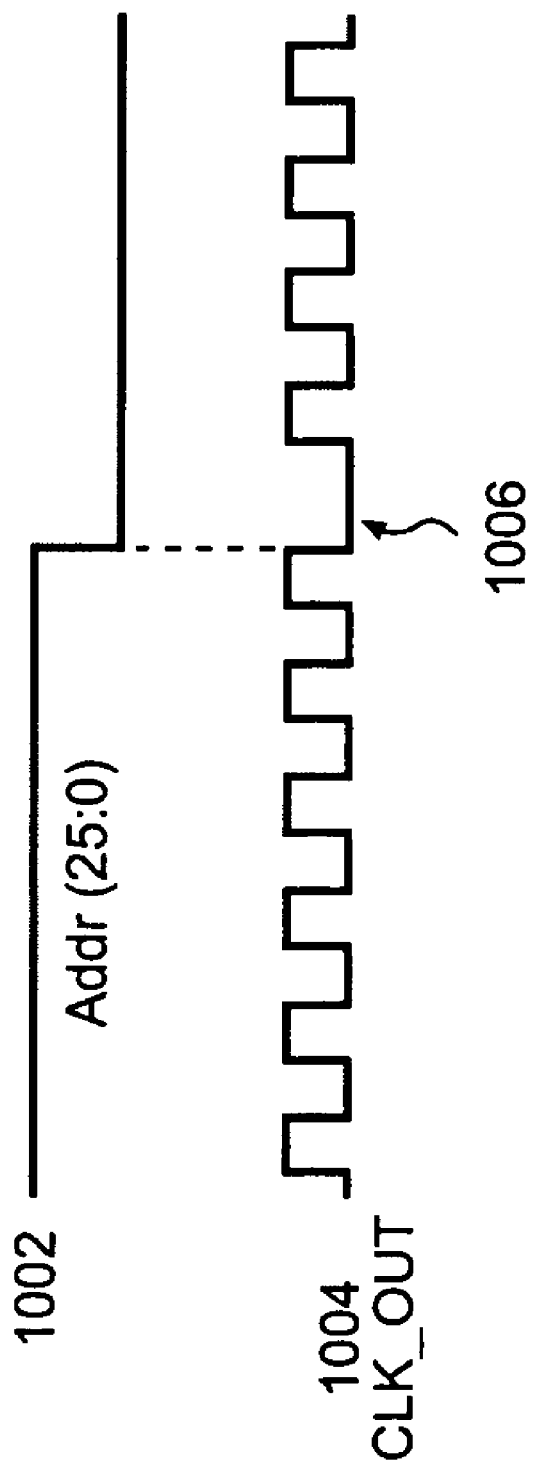
FIG. 11 is an illustration showing waveforms, including a clock out waveform, according to one or more embodiments of the present invention.

FIG. 11 is an illustration showing clock waveforms from the chip under test, according to one or more embodiments of the present invention. FIG. 11 illustrates the distortion of clock out 1004, with the timing circuit (e.g., PLL, DLL, etc.) active, by the noise affecting the timing circuit. The illustrated embodiment shows an example with separate supply and ground terminals, as described above. The PLL is brought out of lock by the transition of the address output drivers switching from logic high to logic low levels, as evidenced by the missing clock pulse 1006.

Figure 12:
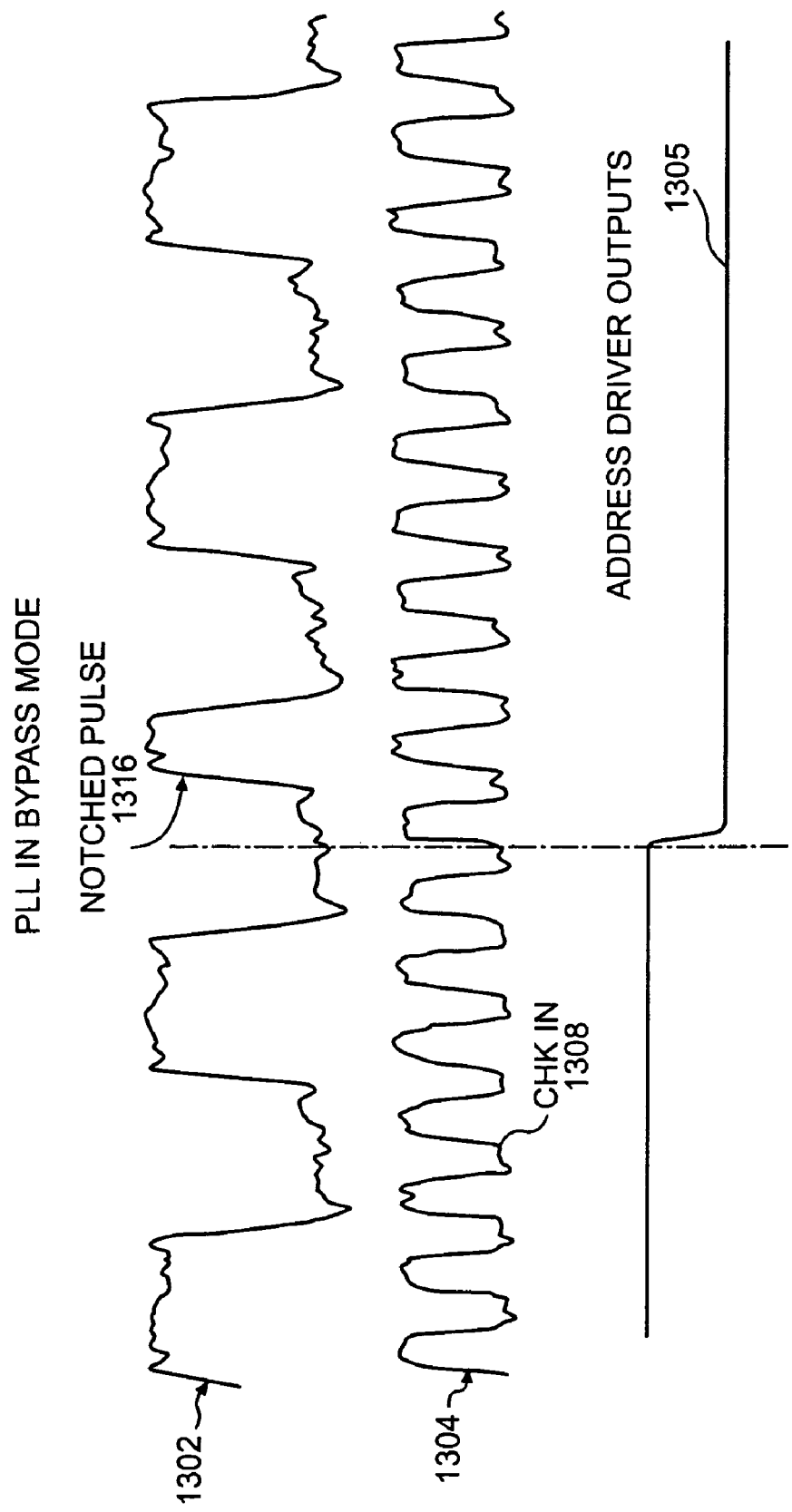
FIG. 12 is an illustration showing additional clock and output waveforms, according to one or more embodiments of the present invention.

FIG. 12 illustrates additional clock waveforms 1302, 1304 and 1305 that were also made on the chip under test with the timing circuit (e.g., PLL, DLL, etc.) in the bypass mode seen in the figure. The middle waveform 1304 of FIG. 12, Clk_in 1308 is the clock signal equal to the input frequency driven from the, e.g., PLL. The upper waveform 1.302 is the Divider out 1302—the output clock from the divider circuit residing in the core. The lower waveform corresponds to the address driver outputs 1305. When the address driver outputs transitions from a high to a low, it distorts the output divider pulse as shown in FIG. 12 for the timing circuit (e.g., PLL) in bypass mode. This distortion contracts the width of the 'Divider out' pulse.

Traditionally, power supply and ground systems for timing circuits have been isolated in integrated chip design. Embodiments of the present invention, however, connect the PLL ground systems with the core ground and keep the output driver ground terminals separate from the combined core ground, which sufficiently attenuates noise perturbations caused by output drivers switching from high to low logic levels, and permits the system to operate without functional error or distorted clock waveforms, and these improvements have been verified both via simulations and testing of the various physical components.

Figure 13:
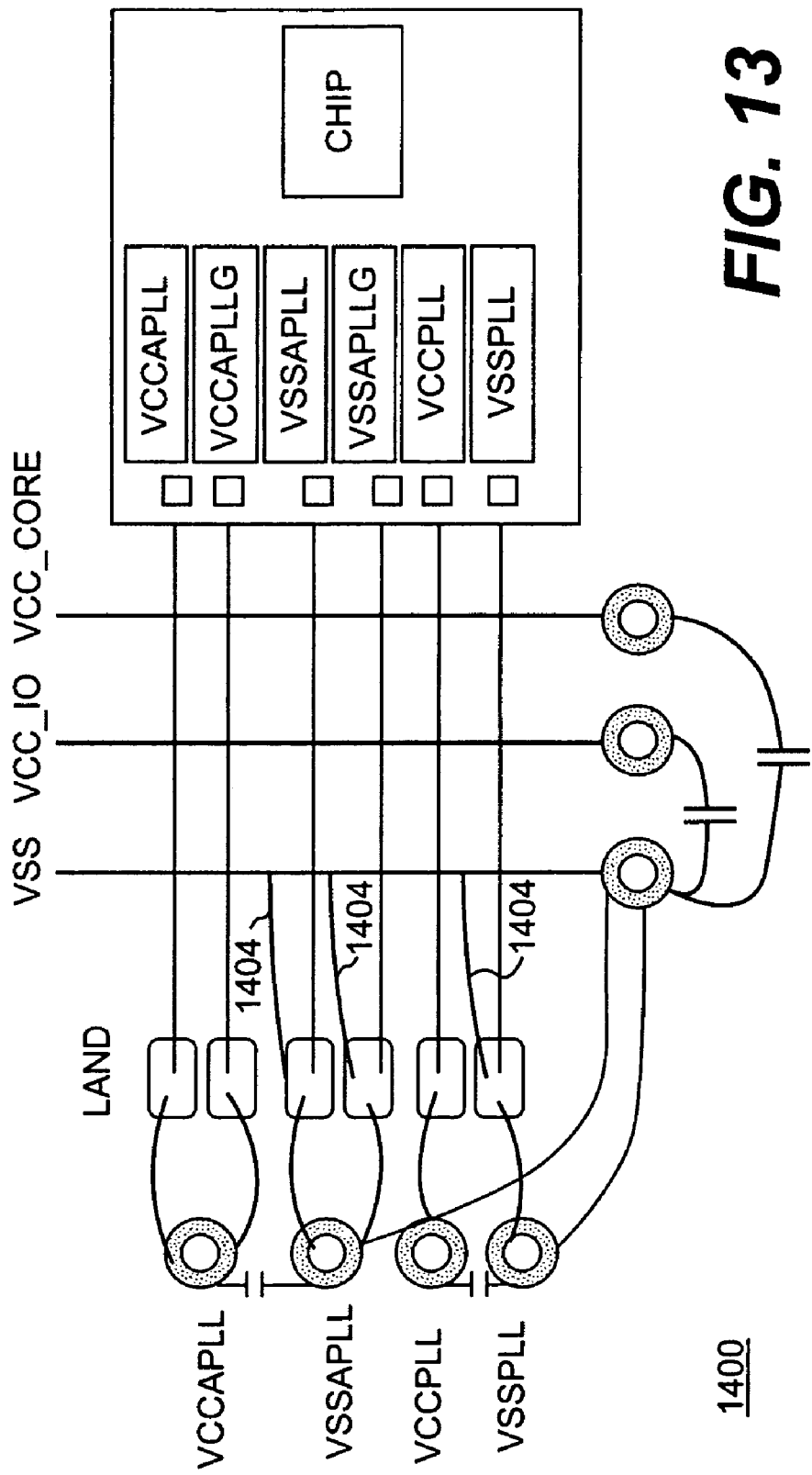
FIG. 13 is a package-level circuit diagram illustrating a bonding arrangement according to one or more embodiments of the present invention.

According to one or more embodiments, a bonding option that eliminated the failure mechanisms (e.g., functional error, distorted clock waveforms, etc.) is shown in the package 1400 illustrated in FIG. 13. This package 1400 includes many of the same elements as the package 800 illustrated in FIG. 8. Note, however, that all of the PLL ground $V_{SS}$ are electrically connected to the substrate $V_{SS}$ connection via a bond/lead 1404, thereby providing a low impedance path from $V_{SSAPLL}$, $V_{SSAPLLG}$, and $V_{SSPLL}$ to the $V_{SS}$ package plane.

Several of the many advantages present from such a configuration are indicated below. First, new low voltage board environments are less noisy than in the past when CRT control drivers were common. Present PLLs suffer from chip generated I/O noise as before. Specifically, when a high current driver, i.e., PCI driver with a high capacitive load discharges from a logic "1" to a logic "0," the discharge current not dissipated by the external I/O ground pin leads causes the common p substrate to be elevated or "bounce." This perturbation of the substrate ground is out of phase with the delayed phase ($R_{sub}C_{pp1}$) of the PLL ground node, thereby, momentarily cutting off the drive of the PLL internal circuits. Second, input/output noise occurs when the output drivers are in close proximity; thus, moving the PLL from the pad ring introduces substrate resistance which attenuates PLL ground bounce to common tied PLL grounds to the core grounding system. And, finally, the ESD protection system must be designed so that coupling of the output driver to PLL ground does not occur.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims, and variances thereof as given by the present disclosure.

We claim:

1. A semiconductor integrated circuit that attenuates coupled noise comprising:
    a first circuit having a first power supply and a first ground supply; and
    a second circuit having a second power supply and a second ground supply;
    wherein the first ground supply is coupled with the second ground supply to form a common ground;
    wherein the first power supply and the second power supply are kept separate, with each power supply being capacitively coupled directly to the common ground with a filter unique to each power supply; and
    an input output circuit having at least one output driver;
    wherein the filter unique to each power supply suppresses noise generated by the output driver.

2. The semiconductor integrated circuit of claim 1, wherein the second power supply has an electro-static discharge structure unique to the second power supply to prevent noise coupling through electro-static discharge structures tied to common nodes.

3. The semiconductor integrated circuit of claim 1, wherein the second circuit is a timing circuit.

4. The semiconductor integrated circuit of claim 3, wherein the second power supply has an electro-static discharge structure unique to the second power supply to prevent noise coupling through electro-static discharge structures tied to common nodes.

5. The semiconductor integrated circuit of claim 1, wherein the first circuit is an input circuit.

6. The semiconductor integrated circuit of claim 5, wherein the second circuit is a timing circuit.

7. The semiconductor integrated circuit of claim 6, wherein the second power supply has an electro-static discharge structure unique to the second power supply to prevent noise coupling through electro-static discharge structures tied to common nodes.

8. The semiconductor integrated circuit of claim 3, wherein the timing circuit is a phase lock loop.

9. The semiconductor integrated circuit of claim 8, wherein the second power supply has an electro-static discharge structure unique to the second power supply to prevent noise coupling through electro-static discharge structures tied to common nodes.

10. The semiconductor integrated circuit of claim 3, wherein the first circuit is an input circuit.

11. The semiconductor integrated circuit of claim 10, wherein the second power supply has an electro-static discharge structure unique to the second power supply to prevent noise coupling through electro-static discharge structures tied to common nodes.

12. The semiconductor integrated circuit of claim 3, wherein the first circuit is a core circuit.

13. The semiconductor integrated circuit of claim 12, wherein the second power supply has an electro-static discharge structure unique to the second power supply to prevent noise coupling through electro-static discharge structures tied to common nodes.

14. The semiconductor integrated circuit of claim 1, wherein the filter includes a capacitor.

15. The semiconductor integrated circuit of claim 1, wherein the filter includes a capacitor and a resistor.

16. The semiconductor integrated circuit of claim 1, wherein the timing circuit is a separate system clock.

17. The semiconductor integrated circuit of claim 16, wherein the second power supply has an electro-static discharge structure unique to the second power supply to prevent noise coupling through electro-static discharge structures tied to common nodes.

18. The semiconductor integrated circuit of claim 16, wherein the timing circuit includes a phase-locked loop.

19. The semiconductor integrated circuit of claim 16, wherein the timing circuit includes a delay-locked loop.

20. A semiconductor integrated circuit that attenuates coupled noise comprising:

a circuit having a power supply and a ground supply;

a timing circuit having a power supply and a ground supply;

wherein the timing circuit ground supply is coupled with the circuit ground supply to form a common ground;

wherein the circuit power supply and the timing circuit power supply are kept separate, with each power supply being capacitively coupled directly to the common ground with a filter unique to each power supply; and an input output circuit having at least one output driver;

wherein the filter unique to each power supply suppresses noise generated by the output driver.

21. A semiconductor integrated circuit that attenuates coupled noise comprising:

an input circuit having a power supply and a ground supply;

a timing circuit having a power supply and a ground supply;

wherein the timing circuit ground supply is coupled with the input circuit ground supply to form a common ground;

wherein the timing circuit power supply and the input circuit power supply are kept separate, with each power supply being capacitively coupled directly to the common ground with a filter unique to each power supply; and an input output circuit having at least one output driver;

wherein the filter unique to each power supply suppresses noise generated by the output driver.

22. A semiconductor integrated circuit that attenuates coupled noise comprising:

a base circuit having a core power supply and a core ground supply;

a timing circuit having a power supply and a ground supply;

wherein the timing circuit ground supply is coupled with the core ground supply to form a common ground;

wherein the timing circuit power supply and the base circuit power supply are kept separate, with each power supply being capacitively coupled directly to the common ground with a filter unique to each power supply; and an input output circuit having at least one output driver;

wherein the filter unique to each power supply suppresses noise generated by the output driver.

23. A semiconductor integrated circuit that attenuates coupled noise comprising:

a timing circuit having a power supply and a ground supply;

an output driver having a power supply and a ground supply;

wherein the timing circuit ground supply is coupled with the output driver ground supply to form a common ground;

wherein the timing circuit power supply and the output driver power supply are kept separate, with each power supply being capacitively coupled directly to the common ground with a filter unique to each power supply; and an input output circuit having at least one output driver;

wherein the filter unique to each power supply suppresses noise generated by the output driver.

24. A method of attenuating coupled noise in a semiconductor integrated circuit including a first circuit and a second circuit, the method comprising the steps of:

coupling a first ground supply to the first circuit with a second ground supply to the second circuit to form a common ground;

electrically separating a first power supply to the first circuit and a second power supply to the second circuit;

capacitively coupling each power supply directly to the common ground with a filter unique to each power supply; and using a filter unique to each power supply to suppress noise generated by an output driver of a input output circuit.

* * * * *